(12) United States Patent
Lee

(10) Patent No.: US 6,487,900 B1
(45) Date of Patent: Dec. 3, 2002

(54) METHOD OF TIRE BEAD FLANGE PROFILING

(76) Inventor: Ching-Chih Lee, 7678 Oxgate Ct., Hudson, OH (US) 44236

( * ) Notice: Subject to any disclaimer, the term of this patent is extended or adjusted under 35 U.S.C. 154(b) by 0 days.

(21) Appl. No.: 09/561,281

(22) Filed: Apr. 28, 2000

(51) Int. Cl.⁷ .............................................. G01M 17/02
(52) U.S. Cl. .................. 73/146; 152/544; 152/539; 152/154.1
(58) Field of Search ................ 73/146; 152/50.1, 152/544, 539, 154.1

(56) References Cited

U.S. PATENT DOCUMENTS

| | | | |
|---|---|---|---|
| 4,246,950 A | 1/1981 | Welter ...................... | 152/381.4 |
| 5,010,938 A | 4/1991 | Assaad et al. .............. | 152/539 |
| 5,297,606 A | 3/1994 | Pompier et al. ............ | 152/539 |
| 5,332,019 A | 7/1994 | Yoshida et al. ............ | 152/544 |
| 5,445,202 A | 8/1995 | Nguyen et al. ............. | 152/454 |
| 5,460,214 A | 10/1995 | Fujita et al. ................ | 152/540 |
| 5,529,103 A | 6/1996 | Lobb et al. ................. | 152/454 |
| 5,641,900 A | 6/1997 | Di Bernardo et al. ........ | 73/146 |
| 5,676,777 A | 10/1997 | Watanabe ................... | 153/540 |

*Primary Examiner*—William Oen
*Assistant Examiner*—Jermaine Jenkins
(74) *Attorney, Agent, or Firm*—David L. King

(57) ABSTRACT

The method of designing a bead flange profile (24) for a pneumatic tire (30) to be mounted on a design rim (40) as specified for the tire size has the steps of (a) selecting a design rim and a cured tire construction and bead profile (33); (b) predicting or measuring the tire deformation upon mounting and inflation; (c) analyzing the deformation to show the compressed beat seat profile (23) and the bead flange profile (24) contacting the rim flange; (d) identifying any gaps between the tire (30) and the rim (40); (e) modifying the tire's bead flange profile (24) to eliminate any gaps by moving selected points on the bead flange profile (24) in proportion to the local gap sizes; (f) shifting all modified points axially inward by a distance so that the molded base width remains the same as the original profile (24); and then (g) smoothing the connections between the modified portion and the rest of the bead profile (33).

3 Claims, 5 Drawing Sheets

METHOD OF TIRE BEAD FLANGE PROFILING

TECHNICAL FIELD

The present invention relates to the fitment of the bead area or profile of a pneumatic tire relative to the rim flange to which the tire is to be mounted, more particularly the invention relates to an improved method of profiling this portion of the tire's bead.

BACKGROUND OF THE INVENTION

Historically, with the introduction of the tubeless type tire, the fitment of the bead portions of the tire to the design rim has increased in significance. This fitment insures that the tire remains air tightly sealed and securely fixed to the rim during vehicle use.

The typical rim has a ledge and a flange that define the contact zone with the tire bead. The tire bead has a first annular surface between the bead heel and bead toe that upon assembly to the rim contacts the rim ledge. The bead also has a second annular surface radially outward of the bead heel. This annular surface contacts the rim flange when the tire is mounted and inflated on the rim.

The prior art teaches the use of a rim with a cylindrical or very slightly conical ledge. Typically for a passenger tire the rim ledge was inclined at an angle of 5° relative to the axis of rotation of the tire. To ensure a proper fitment, the tire beads had an annular surface having a similar 5° inclination relative to the axis of rotation, the beads having a slightly smaller diameter than the rim ledge, thus upon assembly, an interference fit would be achieved.

As a later development, the radially innermost flexible portion of the tire between the toe and the annular tensile member comprised an inclined surface about 10° or 5° greater than the rim ledge. This added interference created by the angular variation facilitated sealing the tire.

Typically the portion of the bead's second annular surface adjacent the heel and the matching portion of the rim flange are at 90° relative to the wheel axis. This annular surface area being under pressure while the tire is inflated contacts the rim flange, helping to fasten the tire on the rim.

The prior art tires essentially relied on the rim ledge and flange orientation to establish the shape and orientation of the bead, with the exception being the flexible toe portion of the bead.

Generally, the optimal bead fitment relationship occurs when the tire bead profile exactly fits the rim profile with no gaps. Quite often, however, there is a separation between the tire and the rim in the heel-to-flange region. This gap or separation can occur around the entire peripheral surface or it may be locally occurring with the rim flange and tire bead sporadically making contact.

In either case the gap in the flange region provides no assistance to the tire's resistance to rim slippage. Often the gap is caused by the rotation of the bead upon tire inflation and mounting due to a nonuniform tire-rim interference along the rim ledge and unequal cord tension on the two sides of the bead core.

Ideally the tire when mounted to its design rim will fit flush against the rim flange. A poor fitment in the flange area can cause the bead seat profile of the tire to seat axially inward of the design location, thus lowering the amount of contact pressure that should be generated under the bead core.

In U.S. Pat. No. 5,445,202 assigned to The Goodyear Tire & Rubber Company the second annular surface extending radially outward along the rim flange region was inclined at an angle at least 3° relative to the rim flange. This allowed the bead to rotate as the tire is mounted to enable the second surface to contact the rim flange without obstructing the bead seat profile from fully engaging the rim ledge.

In another Goodyear patent, U.S. Pat. No. 5,464,051, the inclination of this second annular surface was recommended to be in the range of 0° to 3° relative to the rim flange.

In U.S. Pat. No. 5,332,019 to Yoshida et al a similar observation was made relating to the rim flange gap being the result of an attempt to overlap the profile of bead portions in the region of the bead seat and the flange. Yoshida et al used an x-ray CT scanner to study its effect and found that while the bottom of the bead contacts the rim airtightly a gap formed between side face of the bead portion and the axially inner surface of the rim flange results in the tire having an increase in Radial Runout (RRO) and Force Variation (FV). To solve the problem and provide improved contact between the bead portions and the mating surfaces of the rim, Yoshida et al discloses a special profile based on a mathematical formula. In a cross-section including the tire axis, the bead profile is within a range between a locus of $y=f(x)+1(mm)$ and $f(x)-1(mm)$ which are made when x-value is varied from 15.29 to 0.523 (mm) wherein $f(x)= 3.789+2.4273\ x+0.73024\ x^2+0.12736\ x^3+0.012774\ x^4+6.659\times10^{-4}\ x^5+1.36\times10^{-5}\ x^6$. In the above, $f(x)$ is a function of x, and x and y are the radial and the axial coordinates respectively in millimeters, defining the direction of increase of the x value as being radially inward and the direction of increase of the y-value as being axially inward of the tire. The origin of the x and y coordinates is the bead's sharp point, which is the intersecting point between the straight bead bottom line being inclined at 5 degrees to the tires axis and the straight bead side line parallel to the tire radial direction.

As can be readily appreciated, the problem has been clearly observed by those of skill in the art of tire design and the solutions vary from simplistic to Yoshida's overwhelmingly complex equation with a plus or minus 1 mm variation thus yielding an almost nondecernable profile. In addition, the solution in one case may not be applicable to another because of differences in the bead core, the wrapped-around reinforcing cords, and the bead seat profile resulting in a different bead rotation.

It is an object of the present invention to predict or measure the amount of bead rotation that will occur while a particular tire construction is mounted to its design rim, and to revise the bead flange profile with the anticipated rotation so that after mounting and inflation the tire will fit the rim. The method of bead flange profiling described herein has general applications regardless of the other design aspects of a bead, such as the type and construction of bead core and the type of bead seat profile.

SUMMARY OF THE INVENTION

The method of designing a bead flange profile for a pneumatic tire to be mounted on a design rim as specified for the tire size has the steps of (a) selecting a design rim and a cured tire construction and bead profile; (b) predicting or measuring the tire deformation upon mounting and inflation, (c) analyzing the deformation to show the compressed beat seat profile and the bead flange profile contacting the rim flange from a preselected radially outer point C extending radially inwardly toward the bead heel of the tire; (d)

identifying any gaps between the tire and the rim; (e) modifying the tire's bead flange profile to eliminate any gaps by moving selected points on the bead profile in proportion to the local gap sizes; (f) shifting all the points modified in step (e) axially inward by a distance so that the axially outermost position of the modified profile is the same as the axially outermost position of the original profile; and then (g) smoothing the connections of the modified portion of the bead profile to the rest of the bead profile up to the radially outer contact with the rim flange.

The engineer can then preferably take the adjusted flange profile of step (g) and repeat the steps (a) through (g) to verify no additional gaps exist. If new or additional gaps are found, the steps should be repeated until the analysis predicts no gaps exist between the rim flange and the bead flange profile.

If the engineer wants to, he or she may elect to change the bead core construction, component gauges in the bead area, or the bead seat profile from a first design to a modified or otherwise changed second design, and repeat steps (a) through (g) to accomplish a gap-free fit relationship.

Definitions

"Aspect ratio" of the tire means the ratio of its section height (SH) to its section width (SW) multiplied by 100% for expression as a percentage.

"Axial" and "axially" means lines or directions that are parallel to the axis of rotation of the tire.

"Bead" means that part of the tire comprising an annular tensile member wrapped by ply cords and shaped, with or without other reinforcement elements such as flippers, chippers, apexes, toe guards and chaffers, to fit the design rim.

"Belt structure" or "Reinforcing Belts" means at least two annular layers or plies of parallel cords, woven or unwoven, underlying the tread, unanchored to the bead, and having both left and right cord angles in the range from 17 degrees to 27 degrees with respect to the equatorial plane of the tire.

"Carcass" means the tire structure apart from the belt structure, tread, undertread, and sidewall rubber over the plies, but including the beads.

"Circumferential" means lines or directions extending along the perimeter of the surface of the annular tread perpendicular to the axial direction.

"Cord" means one of the reinforcement strands of which the plies in the tire are comprised.

"Design rim" means a rim having a specified configuration and width. For the purposes of this Specification, the design rim and design rim width are as specified by the industry standards in effect in the location in which the tire is made. For example, in the United States, the design rim is as specified by the Tire and Rim Association. In Europe, the rim is as specified in the European Tyre and Rim Technical Organisation—Standards Manual and the term design rim means the same as the standard measurement rims. In Japan, the standard organization is The Japan Automobile Tire Manufacturer's Association.

"Equatorial plane (EP)" means the plane perpendicular to the tire's axis of rotation and passing through the center of its tread.

"Innerliner" means the layer or layers of elastomer or other material that form the inside surface of a tubeless tire and that contain the inflating fluid within the tire.

"Normal inflation pressure" refers to the specific design inflation pressure and load assigned by the appropriate standards organization for the service condition for the tire.

"Normal load" refers to the specific design inflation pressure and load assigned by the appropriate standards organization for the service condition for the tire.

"Ply" means a continuous layer of rubber-coated parallel cords.

"Radial" and "radially" means directions radially toward or away from the axis of rotation of the tire.

"Radial-ply tire" means a belted or circumferentially-restricted pneumatic tire in which the ply cords which extend from bead to bead are laid at cord angles between 65° and 90° with respect to the equatorial plane of the tire.

"Section height" (SH) means the radial distance from the nominal rim diameter to the outer diameter of the tire at its equatorial plane.

"Section width" (SW) means the maximum linear distance parallel to the axis of the tire and between the exterior of its sidewalls when and after it has been inflated at normal pressure for 24 hours, but unloaded, excluding elevations of the sidewalls due to labeling, decoration or protective bands.

"Shoulder" means the upper portion of a sidewall just below the tread edge.

"Sidewall" means that portion of a tire between the tread and the bead.

"Tread width" means the arc length of the tread surface in the axial direction, that is, in a plane passing through the axis of rotation of the tire.

DETAILED DESCRIPTION OF THE DRAWINGS

DETAILED DESCRIPTION OF THE INVENTION

Figure 1:
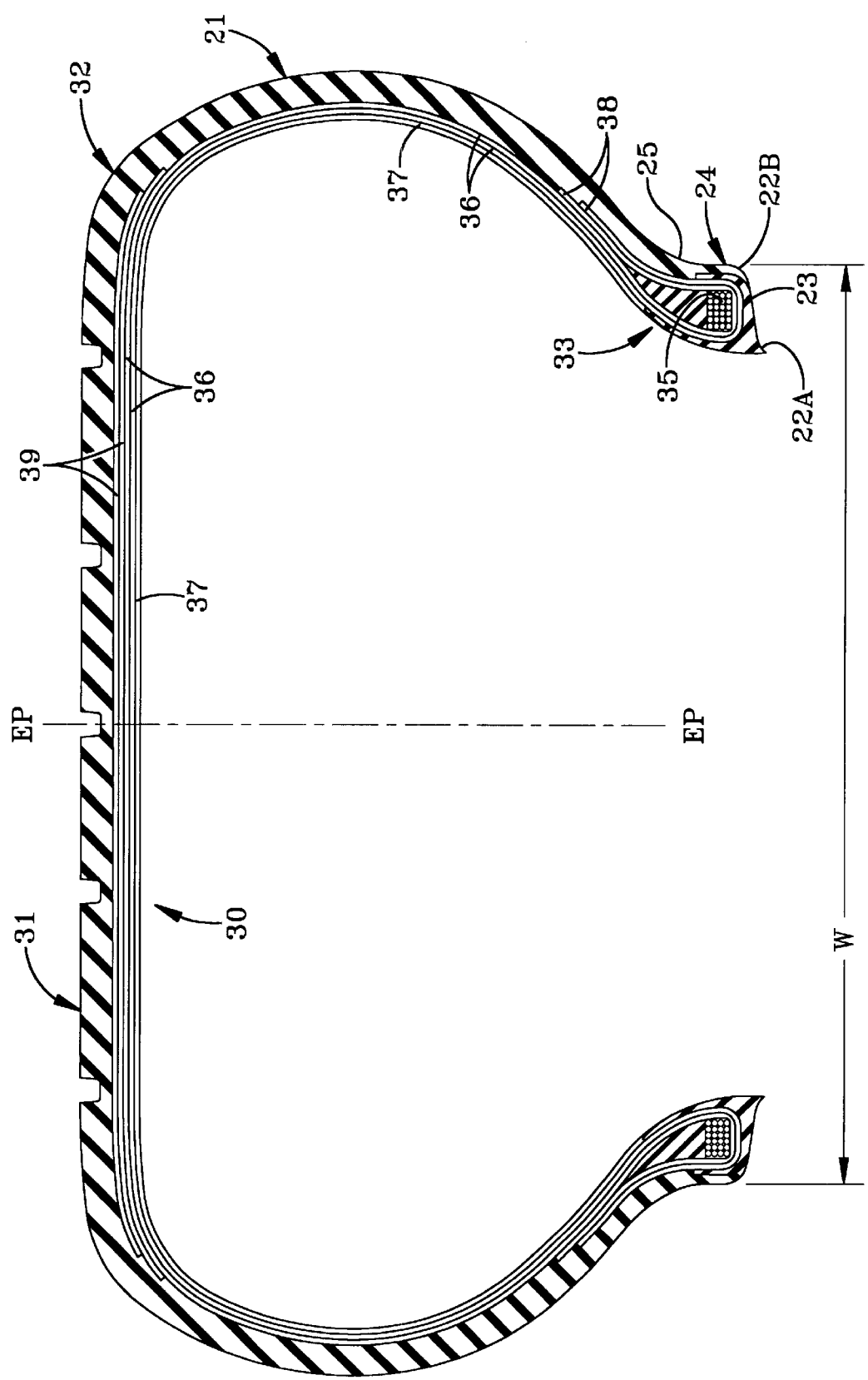
FIG. 1 is a cross-sectional view of the preferred tire made in accordance with the invention.

Although the present invention is not limited to any particular type of tires, we will use an exemplary radial-ply tire for illustration. Referring to FIG. 1, there is illustrated a cross sectional view of a tire (30) made in accordance with the present invention. In the particular embodiment, the tire (30) is a low aspect ratio radial-ply passenger tire. As shown, the beads (33) are spaced axially a distance W equal to the molded base width, it being understood that the tire may have a molded base width different from the design rim width.

The tire (30) is provided with a ground-engaging tread portion (31) which terminates in the shoulder portions (32) at the lateral edges of the tread. Axially outer sidewall portion (21) extends from shoulder portion (32) and terminates in the bead portion (33), the bead portion having an annular inextensible tensile member (35). The tire (30) is further provided with a carcass reinforcing structure (36) which extends from the tensile member (35) through the sidewall portion (21), the tread portion (31), the opposite sidewall portion (21) down to the opposite tensile member (35). The turnup ends (38) of the carcass reinforcing structure (36) are wrapped about the tensile members (35). The tire (30) may include a conventional innerliner (37) forming the inner peripheral surface of the tire (30) if the tire is to be of the tubeless type.

Placed circumferentially about the radially outer surface of the carcass reinforcing structure (36), beneath the tread portion (31), is a tread reinforcing belt structure (39). In an embodiment, the belt structure (39) comprises two single cut belt plies and the cords of the belt plies are oriented at an angle ranging between 17° and 25° with respect to the equatorial plane of the tire. The cords of one belt ply are disposed in an opposite direction to the equatorial plane from that of the cords of the other belt ply. However, the belt structure (39) may comprise any number of belt plies of any desired configuration and the cords may be disposed at any desired angle.

The carcass reinforcing structure (36) includes at least one reinforcing ply structure each comprising one layer of parallel cords. The cords of the reinforcing ply structure (36) are oriented at an angle of at least 75° with respect to the equatorial plane EP of the tire (30). The cords reinforcing the carcass ply may be of any material normally used for cord reinforcement of rubber articles, for example, and not by way of limitation, rayon, nylon and polyester.

Before mounting the tire (30) on a rim (40) and inflating it, it has the shape imparted to it by the mold. After having mounted the tire (30) on the rim, the inclination of the bead portions (33) of the tire (30) is imposed by the rim. Upon inflation the bead portion takes a shape due to the twist imparted by the rim (40) and due to the inflation pressure.

Figure 2:
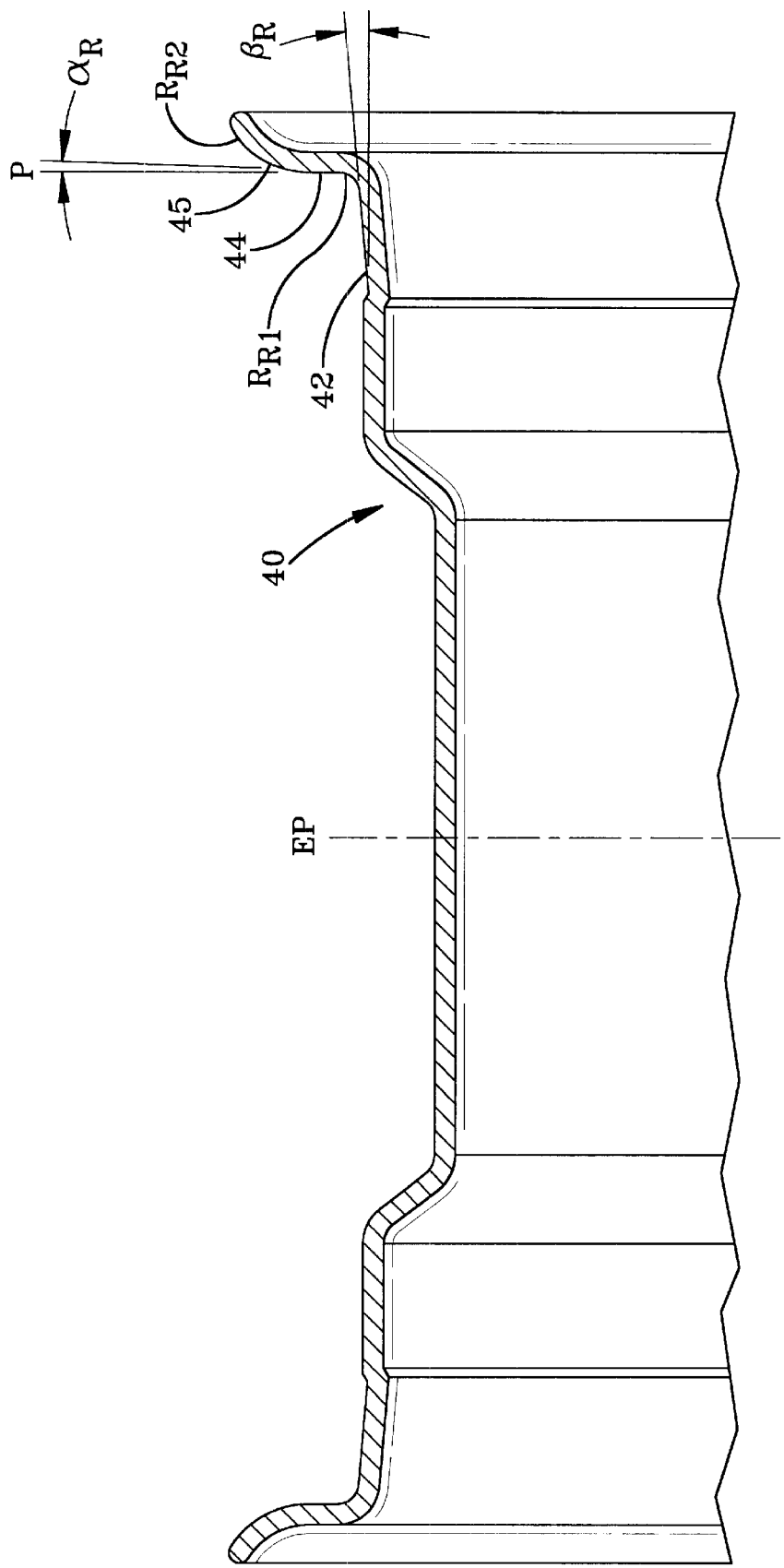
FIG. 2 is a cross sectional view of a standard design rim.

In FIG. 2, a design rim (40) having a ledge (42) inclined at an angle $\beta_R$ relative to the axis of rotation and a flange (44) oriented at an angle $\alpha_R$, with respect to the perpendicular to the axis of rotation is shown; $\alpha_R$ being nominally zero. The angle $\beta_R$ is nominally 5° as shown.

The exemplary tire (30) and the associated design rim (40) are typical of those used in passenger and light truck tires employed on 5° drop center type rims.

The methodology disclosed below is believed applicable to any type of pneumatic tire including commercial truck tires for mounting on rims with 15° tapered ledge and any other types of tires.

Additionally, the bead seat profile (23) may be of any configuration including single angled bead seats in the 5° to 15° range and the more typical 5°/10.5° compound angled bead seats of the prior art passenger and light truck tires.

Secondarily, the cross-sectional shape of the bead core (35) can be of any known configuration. It simply does not matter for purposes of practicing this invention what type of bead core (35) is used. It is only required that the tire structure should be generally established before the engineer applies the methodology to optimize the bead flange profile (24).

Figure 3:
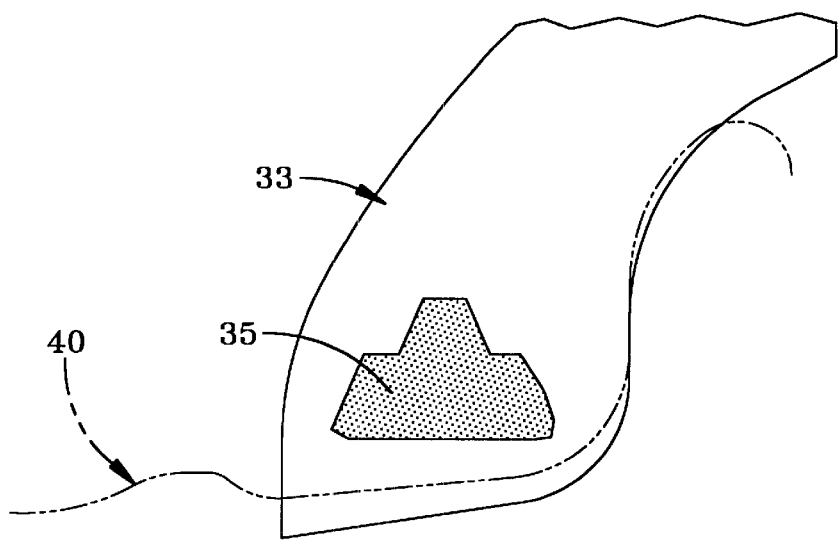
FIG. 3 is a cross sectional view of a prior art tire bead portion superimposed onto a rim.
Figure 4:
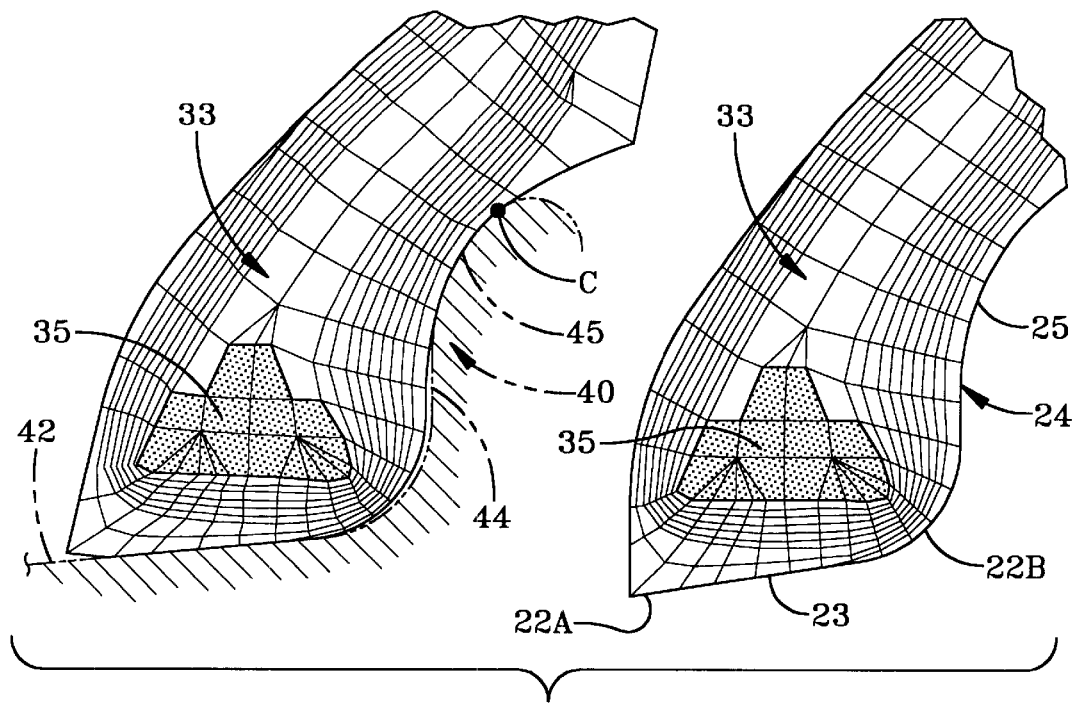
FIG. 4 is a finite element mesh of the tire in FIG. 3, deformed when mounted on the design rim and inflated at 20 psi on the left, revealing a gap between the tire and the rim. The undeformed tire mesh is shown on the right.

A concept and method is disclosed herein to eliminate or at least reduce the tire-rim separation in the heel-to-flange region in the mounted and inflated configuration. The external tire profile in the bead area (33) is usually imparted by a mold ring (also called bead ring). For a given wheel rim, a mold ring profile and a tire construction (designed cured geometry), one can analyze the tire deformation and tire-rim fitment upon mounting and inflation. A typical tire-rim geometrical relationship before mounting is shown in FIG. 3, where a race tire profile and its design rim profile are superimposed. In this particular example the molded base width is larger than the width of the rim, and therefore the rim profile has been shifted axially so that the vertical flange portions of the two profiles (24, 44) coincide. A finite element analysis was carried out to study the tire deformation. Shown in FIG. 4 are the original (on the right) and the deformed meshes after mounting and inflation to 20 psi (on the left). It can be seen that the bead core (35) has rotated and there is a separation between the tire (30) and the rim (40). For this particular tire geometry and construction, two causes tend to rotate the bead (33) clockwise in the orientation of FIGS. 3 and 4: (a) nonuniform tire-rim interference distribution along the ledge (42), and (b) unequal cord tension on the toe (22A) and the heel (22B) sides of the bead core (35) from inflation. A third force exerted by the rim flange on the tire due to interference in the upper flange region (45) tends to rotate the bead (33) counterclockwise.

Figure 5:
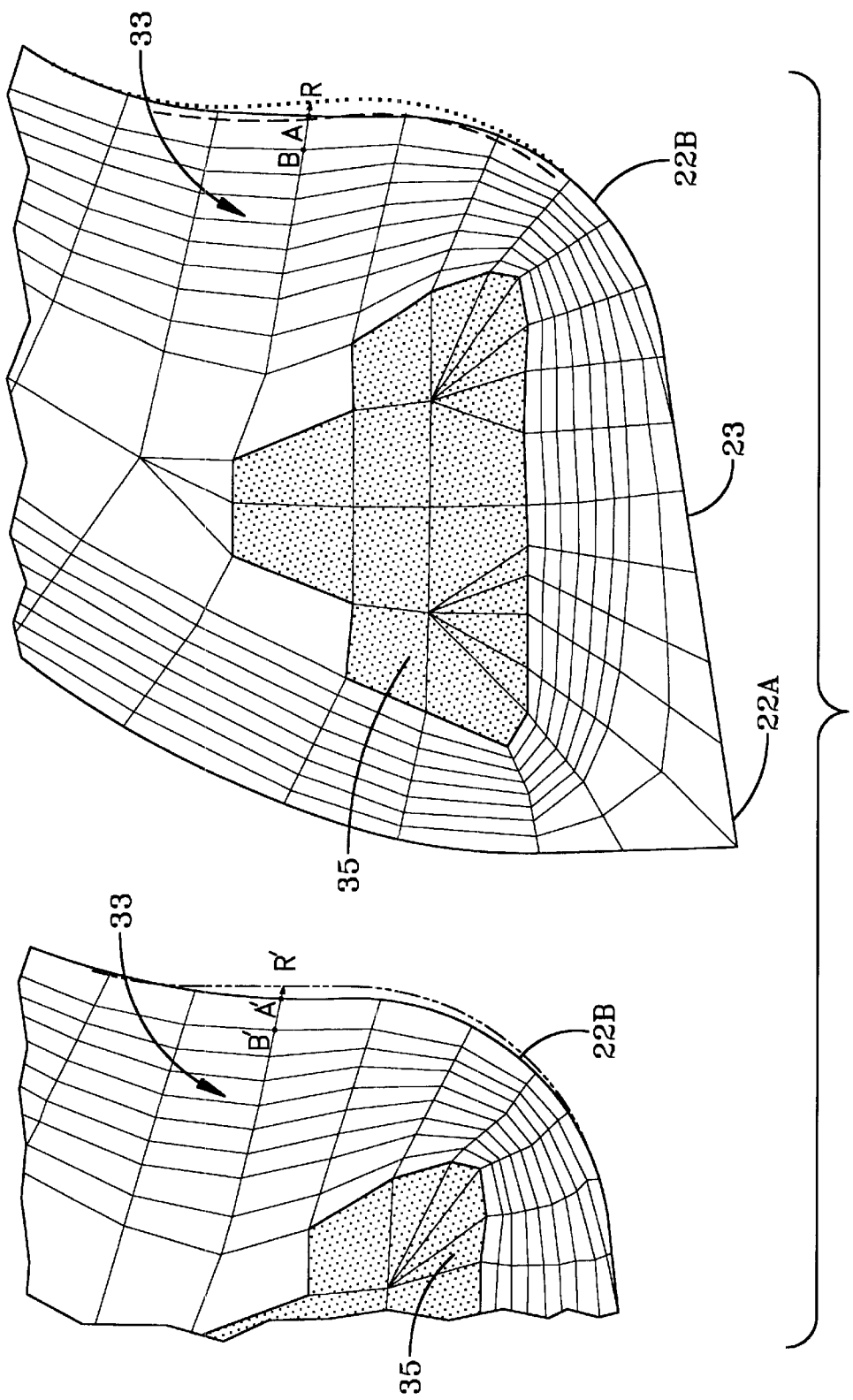
FIG. 5 is a blow-up view of the deformed tire mesh in FIG. 4 showing the resulting gap on the left and the method of revising the bead flange profile for better tire-rim fitment according to the present invention on the right.

Based on the predicted tire-rim separation, one modifies the mold ring profile. A simple scheme is illustrated in FIG. 5. On the left hand side of the figure is part of the deformed configuration. For a finite element node on the tire (30) which is supposed to contact the rim (40) but does not, e.g. point A', one measures the length of the edge (B'A') containing the node and roughly normal to the rim (40), and the amount of the separation (A'R'), or how far the edge has to be extended in order for the node to touch the rim. The ratio of the separation to the edge length (A'R'/B'A') is calculated. Then, one goes to the finite element mesh before mounting, which corresponds to the tire's design drawing and is shown on the right hand side of FIG. 5, and looks for the corresponding node A. The length of the corresponding edge (BA) is measured, and the edge is then extended by the ratio just calculated in the deformed configuration, and the point R is located. Repeating this procedure for each node in the region of separation, one has a new profile (24), as shown by the dotted line in FIG. 5.

A mold with this new profile is wider than the original mold. If one only modifies the dotted line portion of the mold ring profile and the component gauges are not changed, the bead core (35) will move axially in the same direction (outward) and by about the same amount as the profile (24) change. The new tire-rim interference distribution under the bead core (35) and in the upper region (25) of the bead flange profile (24) will be different from the original design. Since the interference distribution is critical in determining the tire-rim contact pressure and the associated maximum frictional torque to resist rim-slip, it is important to make sure the interference distribution is not changed inadvertently. In addition, the connection from the separation region to the rest of the mold ring profile should be smooth. A few design and analysis iterations are usually needed to eliminate the separation without adverse effects.

If intended to keep the molded base width W and most of the tire-rim interference distribution unchanged, one can shift the dotted line to the left (axially inward) so that the axially outermost position of the new profile coincides with the axially outermost position of the original profile, as shown by the long-dashed line in FIG. 5. Smoothing the connection from the separation region to the rest of the mold ring profile, most of which unchanged from the original design, is again necessary and may require a few iterations.

Figure 6:
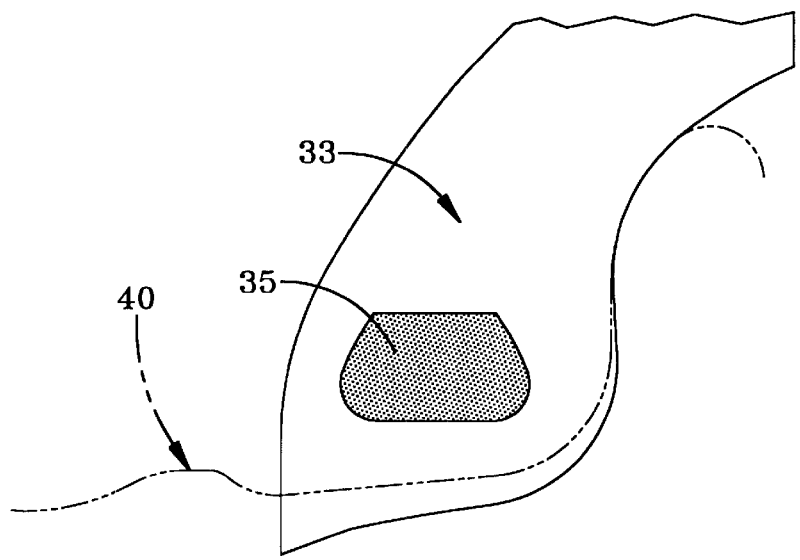
FIG. 6 is a cross sectional view of the preferred bead, revised from the one in FIG. 3 according to the present invention, superimposed over the rim.
Figure 7:
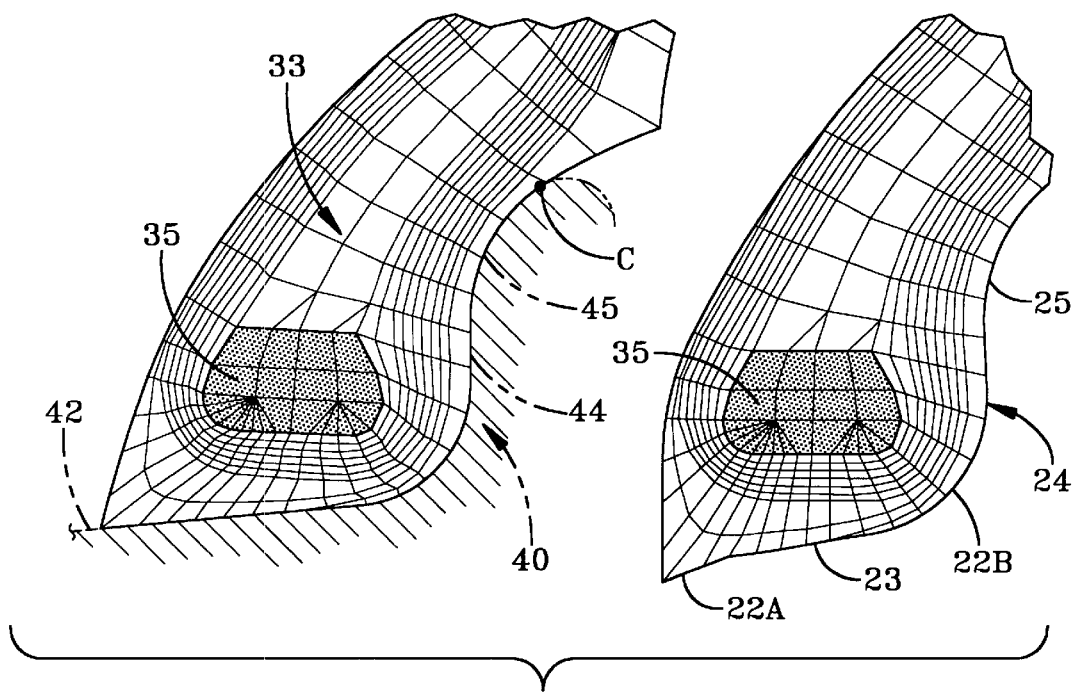
FIG. 7 is a cross sectional view of a bead according to the present invention showing the meshes of the finite element analysis. The figure on the left shows the deformed tire profile when mounted on a rim and inflated, the right being the undeformed profile.

FIG. 6 shows a tire with an "optimized" mold ring profile, and FIG. 7 shows the undeformed (on the right) and the deformed (on the left) meshes in a finite element analysis, indicating that when the tire (40) is mounted and inflated to 20 psi, the tire-rim separation is nearly eliminated extending from a radially outermost contact point C inwardly along the bead flange profile 24 as shown. The mold ring design in FIG. 6 is the result of several modifications and optimizations from the design in FIG. 3. In addition to the elimination of the tire-rim separation in the heel-to-flange region, the modifications include the bead core construction, the rubber gauge under the bead core (35), profiling the bead seat (23) for the highest rim-slip resistance, and elimination of toe-lift. The additional modifications are not considered part of the basic invention relating to the bead flange profile optimization, but can be done complementarily. When such changes in the bead core construction, component gauges in the bead area, and the bead seat profile are made, the method of profiling the bead flange can be repeated taking into account these changes from a first design to a modified or otherwise changed second design. The details of bead seat profile optimization can be found in U.S. patent application Ser. No. 09/562,710 entitled "A Bead Profile for Pneumatic Tires" which was filed concurrently with this patent application, the contents of which are incorporated herein by reference in its entirety.

Although the finite element method has been used to predict the tire deformation upon mounting and inflation in the above illustration of the present invention, it should be noted that other predictive tools, such as the finite difference method, analytical formulas, and empirical calculations can also be used. Alternatively the tire deformation and the gap between the tire (30) and the rim (40) can be obtained by experimental measurements, e.g., using tangential x-ray technique.

What is claimed is:

1. The method of constructing a bead flange profile for a pneumatic tire to be mounted on the design rim as specific in the United States Tire and Rim Association, the European Tyre and Rim Technical Organization-Standards Manual, or the Japan Automobile Tire Manufacturers' Association or any other standard rim specified for the tire size, comprises the steps of:

(a) selecting the design rim or standard rim having a specified configuration and width and a cured tire construction and bead profile;

(b) predicting the deformation of the tire upon mounting and inflation by numerical simulations, analytical formulas, or empirical calculations; or measuring the said deformation by experimental techniques;

(c) analyzing the predicted or measured deformation of the mounted and inflated tire to show the compressed bead seat profile and the bead flange profile contacting the rim flange from a preselected radially outer location C extending radially inwardly toward the bead heel of the tire;

(d) identifying any gaps between the tire and the rim radially inward of the location C;

(e) modifying the bead flange profile of the tire to eliminate any gaps by moving selected points on the bead flange profile in proportion to the local gap sizes thereby forming a new modified bead flange profile wider then the original profile;

(f) shifting all the points of the new modified profile bead flange profile in step (e) axially inward by a distance so that the axially outermost position of the modified bead flange profile wider than the original profile coincides at that radial location with the axially outermost position of the original profile; then (g) smoothing the connections of the modified portion of the bead flange profile to the rest of the profile up to the radially outer contact with the rim flange thus constructing an adjusted flange profile.

2. The method of constructing a bead flange profile for a pneumatic tire of claim 1 further comprising the steps of:

(h) taking the adjusted flange profile of step (g) and repeating the steps (a) through (g) to verify no additional gaps exist, and if a gap exists repeating the steps until the analysis predicts no gaps or the experiment shows no gaps.

3. The method of constructing a bead flange profile for a pneumatic tire of claim 1 further comprising the steps of:

changing the bead core construction, component gauges in the bead area, or bead seat profile, and repeating steps (a) through (g).

* * * * *